(12) United States Patent
Shigematsu et al.

(10) Patent No.: US 6,399,971 B1
(45) Date of Patent: *Jun. 4, 2002

(54) SEMICONDUCTOR DEVICE AND METHOD FOR FABRICATING THE SAME

(75) Inventors: Hisao Shigematsu; Kenji Imanishi; Hitoshi Tanaka, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,543

(22) Filed: Nov. 13, 1998

(30) Foreign Application Priority Data

Apr. 28, 1998 (JP) ............................................ 10-118466

(51) Int. Cl.$^7$ .............................................. H01L 29/737
(52) U.S. Cl. ........................ 257/197; 257/201; 257/615; 257/587; 257/592
(58) Field of Search ................................ 257/197, 198, 257/201, 613, 615, 587, 592

(56) References Cited

U.S. PATENT DOCUMENTS 5,481,120 A * 1/1996 Mochizuki et al. ............ 257/49

FOREIGN PATENT DOCUMENTS

| EP | 0715357 A1 | * 11/1995 | ......... H01L/29/207 |
| JP | 5-326546 | 12/1993 | |
| JP | 8-335588 | 12/1996 | |

* cited by examiner

Primary Examiner—Eddie Lee
Assistant Examiner—Bradley William Baumeister
(74) Attorney, Agent, or Firm—Armstrong, Westerman & Hattori, LLP

(57) ABSTRACT

The semiconductor device comprises a collector layer 14; a base layer 16 of a carbon-doped $Ga_xIn_{1-x}As_ySb_{1-y}$ layer having one surface connected to the collector layer 14; an emitter layer 18 connected the other surface of the base layer 16; a base contact layer 30 of a carbon-doped GaAsSb layer electrically connected to the base layer 16; and a base electrode 32 formed on the base contact layer 30. The semiconductor device of such structure can have a much reduced base resistance $R_B$, whereby InP/GaInAsSb-based HBTs including InP/InGaAs-based HBTs can have higher maximum oscillation frequency $f_{max}$. Because of the carbon-doped semiconductor layer the semiconductor device can have higher reliability.

8 Claims, 11 Drawing Sheets

SEMICONDUCTOR DEVICE AND METHOD FOR FABRICATING THE SAME

BACKGROUND OF THE INVENTION

The present invention relates to a semiconductor device of a hetero-junction bipolar transistor structure, and a method for fabricating the same.

Recently optical communications systems and mobile communication systems which have high efficiency are required. To make these systems highly efficient semiconductor devices are essential. Hetero-junction bipolar transistors (hereinafter called "HBTs"), which are known as high-speed devices, are one of such devices whose efficiency improvement is prospective.

A structure of a conventional HBT will be explained with reference to FIG. 11.

A collector contact layer 102 formed of an n$^+$-InGaAs layer is formed on a semi-insulating InP substrate 100. A collector layer 104 of an i-InGaAs layer is formed on the collector contact layer 102. A base layer 106 of a p$^+$-InGaAs layer is formed on the collector layer 104. An emitter layer 108 of an n-InP layer is formed on the base layer 106. An emitter contact layer 110 of an n$^+$-InGaAs layer is formed on the emitter layer 108. An emitter electrode 112 of WSi film is formed on the emitter contact layer 110. The emitter contact layer 110 and the emitter layer 108 are processed in a mesa-shape, and a base electrode 116 is formed on an exposed part of the base layer 106. The base layer 106 and the collector layer 104 are processed in a mesa-shape, and a collector electrode 118 is formed on an exposed part of the collector contact layer 102. Thus, an InP/InGaAs-based HBT is formed.

To make the HBT-ICs more speedy, a higher maximum oscillation frequency $f_{max}$ is necessary. A maximum oscillation frequency $f_{max}$ is expressed by $$f_{max} = \sqrt{(f_T/(8\pi \times R_B \times C_{BC}))}$$

wherein a maximum cut-off frequency is represented by $f_T$, a base resistance is represented by $R_B$, and a base-collector capacitance is represented by $C_{BC}$. A maximum oscillation frequency $f_{max}$ is proportional to a reciprocal of a square root of a base resistance $R_B$ ($\sqrt{(1/(R_B))}$), and for a higher maximum oscillation frequency $f_{max}$, it is necessary to obtain a lower base resistance $R_B$.

In GaAs-based HBTs, recently carbon (C) is dominantly used as a dopant for the bases from the viewpoint of ensured reliability, etc., and doping techniques for higher concentrations of above $1 \times 10^{20}$ cm$^{-3}$ have been developed.

On the other hands, in InP/InGaAs-based HBTs, actually doping techniques using carbon as a dopant for the base have not been sufficiently established. The base layer cannot be heavily doped with carbon, and this will be because carbon is not dissociated from hydrogen in forming InGaAs layer to be the base layer to be taken in the films in the form of CH, and the carbon does not function as an acceptor (hydrogen passivation). This phenomenon is conspicuous especially in MOCVD method using hydrogen as a carrier gas and a hydrogen content gas as a source gas.

As a result, InP/InGaAs-based HBTs have very high maximum cut-off frequencies $f_T$ but cannot have sufficiently maximum oscillation frequencies $f_{max}$.

SUMMARY OF THE INVENTION

An object of the present invention is to provide a structure of a semiconductor device which enables an InP/InGaAs-based HBT to have a lower base resistance, and a method for fabricating the same.

The above-described object can be achieved by a semiconductor device comprising: a collector layer; a base layer of a carbon-doped Ga$_x$In$_{1-x}$As$_y$Sb$_{1-y}$ layer having one surface connected to the collector layer; an emitter layer connected the other surface of the base layer; a base contact layer of a carbon-doped GaAsSb layer electrically connected to the base layer; and a base electrode formed on the base contact layer. The semiconductor device of such structure can have a much reduced base resistance $R_B$, whereby InP/GaInAsSb-based HBTs including InP/InGaAs-based HBTs can have higher maximum oscillation frequency $f_{max}$. Because of the carbon-doped semiconductor layer the semiconductor device can have higher reliability.

In the above-described semiconductor device, it is preferable that the base contact layer is formed on said one surface or the other surface of the base layer.

In the above-described semiconductor device, it is possible that the base contact layer is formed on a surface of the collector layer connected to the base layer and has a side surface connected to a side surface of the base layer.

In the above-described semiconductor device, it is possible that the base contact layer is formed on a surface of the emitter layer connected to the base layer and has a side surface connected to a side surface of the base layer.

In the above-described semiconductor device, it is possible that the device further comprises a surface passivation layer for protecting the base contact layer formed on the surface of the base contact layer with the base electrode formed on. Because of the surface passivation layer covering the surface of the base contact layer, surface recombination on the base contact layer can be restrained, whereby dependence of current gains on sizes can be restrained, and the semiconductor device can have higher reliability.

In the above-described semiconductor device, it is possible that the base contact layer is formed of a carbon-doped GaInAsSb layer in place of said carbon-doped GaAsSb layer.

In the above-described semiconductor device, it is possible that an As composition y of the Ga$_x$In$_{1-x}$As$_y$Sb$_{1-y}$ is 1, so that the base layer is formed of a InGaAs layer.

In the above-described semiconductor device, it is preferable that an In composition x of the Ga$_x$In$_{1-x}$As$_y$Sb$_{1-y}$ is 0, so that the base layer is formed of a GaAsSb layer.

In the above-described semiconductor device, it is preferable that a dopant concentration of the base contact layer is not less than $1 \times 10^{20}$ cm$^{-3}$.

The above-described object can be also achieved by a method for fabricating a semiconductor device comprising the steps of: forming a first semiconductor layer on a semiconductor substrate; forming a base layer of a carbon-doped Ga$_x$In$_{1-x}$As$_y$Sb$_{1-y}$ layer on the first semiconductor layer; forming a second semiconductor layer on the base layer; patterning the second semiconductor layer in a mesa-shape; forming a base contact layer on the base layer exposed by patterning the second semiconductor layer; and forming a base electrode on the base contact layer. By fabricating the above-described semiconductor device fabricating method, the semiconductor device can have a much reduced base resistance $R_B$, whereby InP/GaInAsSb-based HBTs including InP/InGaAs-based HBTs can have higher maximum oscillation frequency $f_{max}$. Because of the carbon-doped semiconductor layer the semiconductor device can have higher reliability.

In the above-described method for fabricating a semiconductor device, it is preferable that the method further comprises, after the step of patterning the second semiconductor layer, a step of removing the base contact layer in a exposed region which is exposed by patterning the second semiconductor layer, wherein in the step of forming the base contact layer, the base contact layer having a side surface connected to the base layer is formed on the first semiconductor layer exposed by removing the base layer.

In the above-described method for fabricating a semiconductor device, it is preferable that in the step of forming the base layer, the base layer of an InGaAs layer which corresponds to the $Ga_xIn_{1-x}As_ySb_{1-y}$ layer whose As composition y is 1, or a GaAsSb layer which corresponds to the $Ga_xIn_{1-x}As_ySb_{1-y}$ layer whose In composition X is 0 is formed.

In the above-described method for fabricating a semiconductor device, it is preferable that in the step of forming the base contact layer, the base contact layer is formed of a material which lattice-matches with a material forming the base layer. The base contact layer is formed of a material which lattice-matches with a material forming the base layer, whereby characteristic deterioration of the semiconductor device due to lattice deformation can be prevented.

In the above-described method for fabricating a semiconductor device, it is preferable that in the step of forming the base contact layer, the base contact layer is formed of a carbon-doped GaAsSb layer or a carbon-doped GaInAsSb layer. The base contact layer is formed of such carbon-doped materials, whereby the base contact layer can effectively have a low resistance, and the semiconductor device can have higher reliability.

In the above-described method for fabricating a semiconductor device, it is preferable that the method further comprises, before the step of forming the base contact layer, a step of thermal-treating for eliminating hydrogen in the base layer. Hydrogen in the base layer is eliminated, whereby carbon bonded with the hydrogen is electrically activated, whereby the base layer can have a further lower resistance.

In the above-described method for fabricating a semiconductor device, it is preferable that the method further comprises, after the step of patterning the second semiconductor layer, a step of forming a sidewall insulation film on a side wall of a mesa of the second semiconductor layer.

In the above-described method for fabricating a semiconductor device, it is preferable that the method further comprises, after the step of forming the base contact layer, a step of forming a surface passivation layer on the base contact layer for protecting the base contact layer. Because of the surface passivation layer covering the surface of the base contact layer, surface recombination on the base contact layer can be restrained, whereby dependence of current gains on sizes can be restrained, and the semiconductor device can have higher reliability.

In the above-described method for fabricating a semiconductor device, it is preferable that the first semiconductor layer or the second semiconductor layer is an emitter layer of an InP layer.

The structure of the semiconductor device according to the present invention is applicable to not only a semiconductor device including a collector layer, a base layer and an emitter layer sequentially deposited on a semiconductor substrate, but also a semiconductor device of the so-called collector-up structure including an emitter layer, a base layer and a collector layer sequentially deposited on a semiconductor substrate.

DETAILED DESCRIPTION OF THE INVENTION

A First Embodiment

A semiconductor device and the method for fabricating the same according to a first embodiment of the present invention will be explained with reference to FIGS. 1, 2A–2C and 3A–3C.

Figure 1:
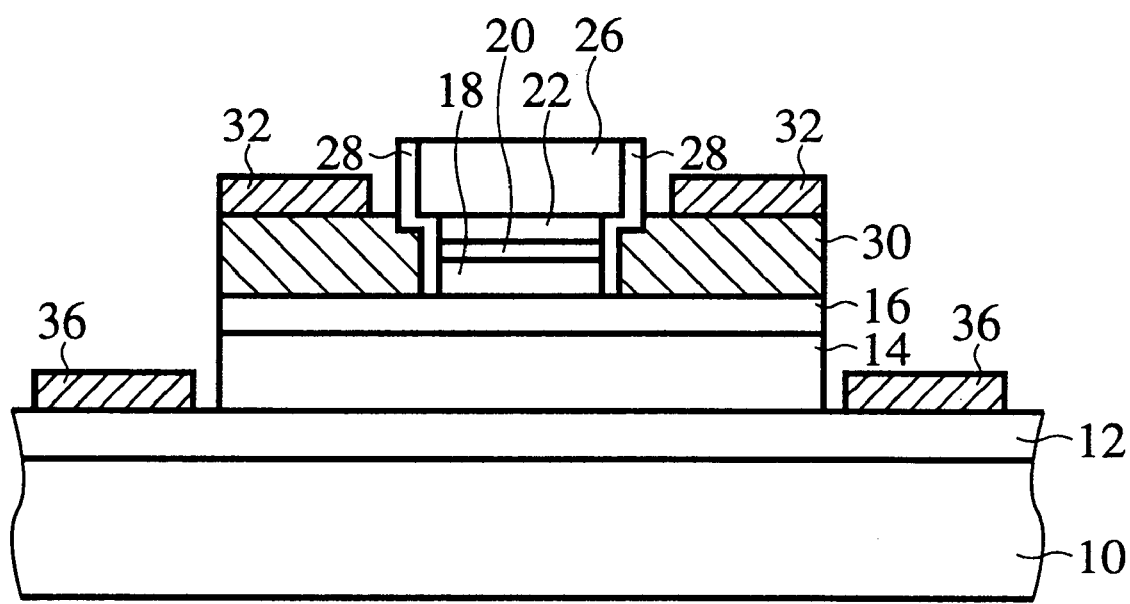
FIG. 1 is a diagrammatic sectional view of the semiconductor device according to a first embodiment of the present invention.

FIG. 1 is a diagrammatic sectional view of the semiconductor device according to the present embodiment, which shows a structure thereof, and FIGS. 2A–2C and 3A–3C are sectional views of the semiconductor device according to the present embodiment in the steps of the method for fabricating the semiconductor device according to the present embodiment.

First, the structure of the semiconductor device according to the present embodiment will be explained with reference to FIG. 1.

A collector contact layer 12 of an $n^+$-InGaAs layer is formed on a semi-insulating InP substrate 10. A collector layer 14 of an i-InGaAs layer is formed on the collector contact layer 12. A base layer 16 of a $p^+$-InGaAs layer is formed on the collector layer 14. An emitter layer 18 of an n-InP layer is formed on the base layer 16. An emitter contact layer 20 of an $n^+$-InP layer and an emitter contact layer 22 of an $n^+$-InGaAs layer are formed on the emitter layer 18. An emitter electrode 26 of WSi (tungsten silicide) film is formed on the emitter contact layer 22. The emitter contact layers 20, 22 and the emitter layer 18 are processed in a mesa-shape, and a sidewall insulation film 28 of SiN film is formed on the side wall of the emitter mesa. A base contact layer 30 of a $p^{++}$-GaAsSb layer is formed on the base layer 16, which is exposed. A base electrode 32 is formed on the base contact layer 30. The base contact layer 30, the base layer 16 and the collector layer 14 are processed in a mesa-shape. A collector electrode 36 is formed on the contact layer 12, which is exposed. Thus, an InP/InGaAs-based HBT is formed.

The semiconductor device according to the present embodiment is characterized in that the base contact layer 30 of a $p^{++}$-GaAsSb layer is formed on the base layer 16.

A base resistance $R_B$, which influences a maximum oscillation frequency $f_{max}$, is determined by a sheet resistance of the base layer and a contact resistance between the base layer and the base electrode.

Figure 11:
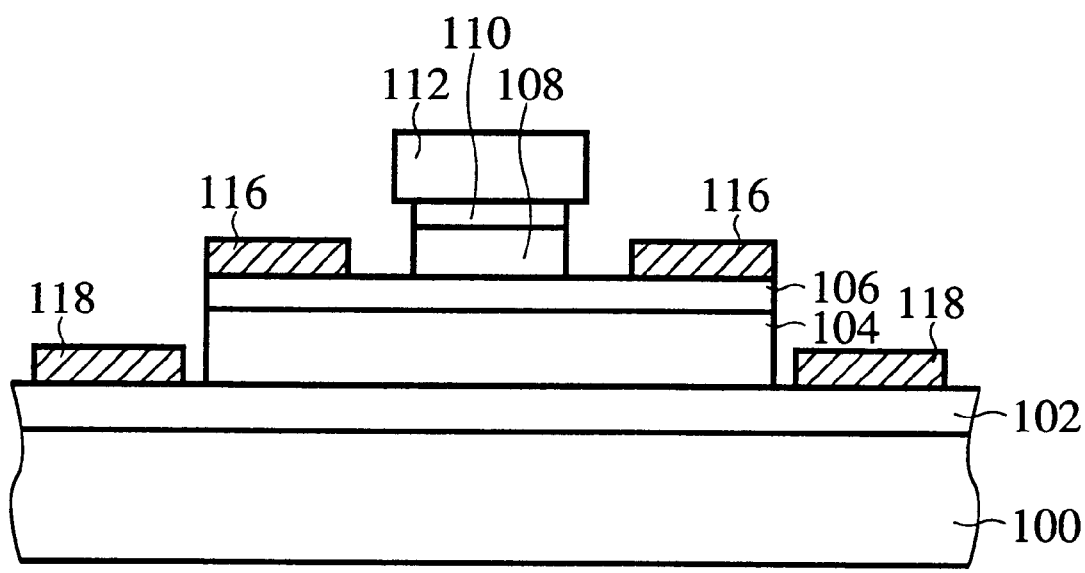
FIG. 11 is a diagrammatic sectional view of the conventional semiconductor device, which shows a structure thereof.

In the conventional semiconductor device shown in FIG. 11, the base layer 106 is formed of the carbon-doped InGaAs, but in this case unless the base layer 106 has a resistance sufficiently reduced, resultantly a base resistance $R_B$ is much increased, which leads to a lower maximum oscillation frequency $f_{max}$.

However, in the semiconductor device according to the present embodiment shown in FIG. 1, because of the base contact layer 30 of a $p^{++}$-GaAsSb layer formed on the base layer 16, even if the base layer 16 does not have a sufficiently low resistance, the base contact layer 30 can much reduce a resistance between an intrinsic base region (the region of the base layer 16 immediately below the emitter layer 18) and the base electrode 32. Accordingly, a much reduced base resistance $R_B$ can be obtained, and a higher maximum oscillation frequency $f_{max}$ can be obtained.

Because of the base electrode 32 formed on the base contact layer 30 of a $p^{++}$-GaAsSb layer of a low resistance, a contact resistance between the base electrode 32 and the base layer 16 can be lowered.

Then, the method for fabricating the semiconductor device according to the present embodiment will be explained with reference to FIGS. 2A–2C and 3A–3C.

Figure 2A:
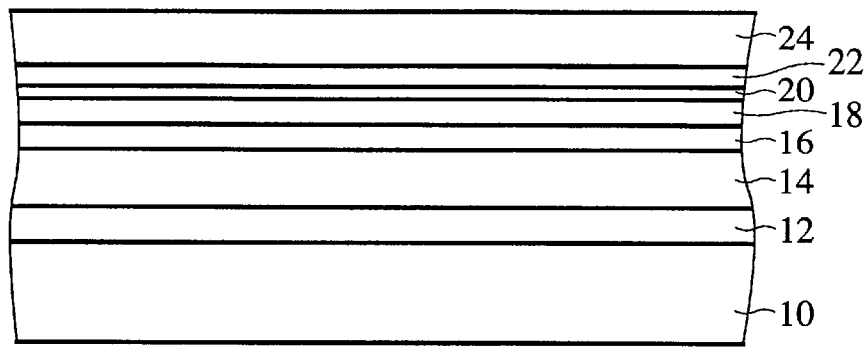
FIGS. 2A–2C and 3A–3C are sectional views of the semiconductor device according to the first embodiment in the steps of the method for fabricating the same, which explain the method.

The collector contact layer 12 of an $n^+$-InGaAs layer (film thickness: 350 nm; electron concentration: $1\times10^{19}$ cm$^{-3}$), the collector layer 14 of an i-InGaAs layer (film thickness: 300 nm), the base layer 16 of a $p^+$-InGaAs layer (film thickness: 30 nm; hole concentration: $1\times10^{19}$ cm$^{-3}$), the emitter layer 18 of an n-InP layer (film thickness: 50 nm; electron concentration $3\times10^{17}$ cm$^{-3}$), the emitter contact layer 20 of an $n^+$-InP layer (film thickness: 25 nm; electron concentration $5\times10^{18}$ cm$^{-3}$) and the emitter contact layer 22 of an $n^+$-InGaAs layer (film thickness: 50 nm; electron concentration; $1\times10^{19}$ cm$^{-3}$) are sequentially deposited on a semi-insulating InP substrate 10 by, e.g., MOCVD method. Then, the WSi layer 24 is deposited on the emitter contact layer 22 by, e.g., sputtering method (FIG. 2A).

Then, the WSi film 24 is patterned by, e.g., dry etching to form the emitter electrode 26 of the WSi film 24.

Subsequently, the emitter contact layer 22 of the $n^+$-InGaAs layer is selectively etched with the emitter electrode 26 as a mask and by the use of an etchant of, $H_3PO_4$:$H_2O_2$:$H_2O$ solution.

Then, also with the emitter electrode 26 as a mask, the emitter contact layer 20 and the emitter layer 18 are selectively etched by the use of an etchant of, e.g., HCl:$H_3PO_4$ solution.

Figure 2B:
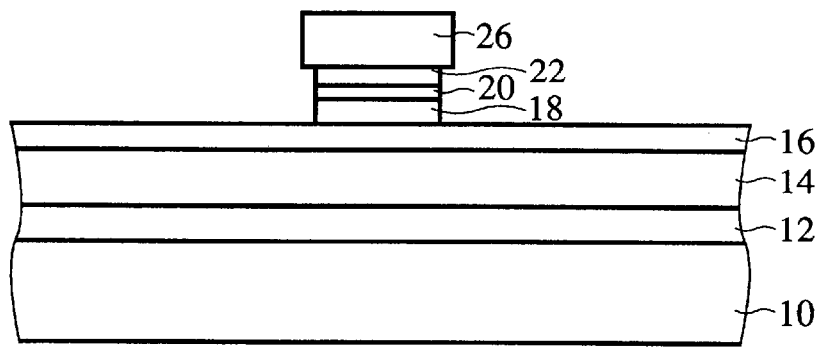

Thus, an emitter mesa of the emitter layer 18, the emitter contact layer 20, the emitter contact layer 22 and the emitter electrode 26 is formed (FIG. 2B).

Figure 2C:
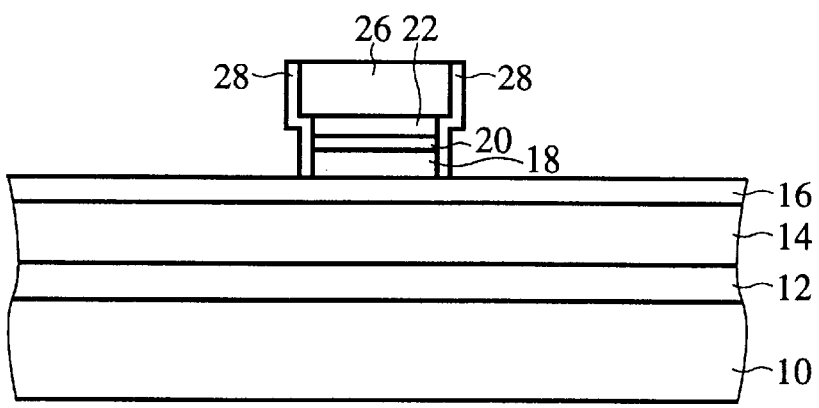

Next, SiN film is deposited on the entire surface by, e.g., CVD method and anisotropically etched to leave the SiN film on only the side wall of the emitter mesa. Thus, the sidewall insulation film 28 of the SiN film is formed on the side wall of the emitter mesa (FIG. 2C).

Subsequently, the substrate with the emitter mesa thus formed is annealed. This annealing is for eliminating hydrogen introduced into the base layer 16 during the film depositing step, and can prevent hydrogen passivation. The annealing at above about 300° C. can eliminate hydrogen in the film.

In the method for fabricating the semiconductor device according to the present embodiment, the InGaAs layer of the base layer 16 is annealed in its exposed state, whereby hydrogen can be removed more effectively than in a case that the emitter layer 18, etc. are formed on the base layer 16.

Next, the base contact layer 30 of an 125 nm-thick $p^{++}$-GaAsSb layer heavily doped with carbon is selectively grown by, e.g., MOCVD method on the base layer 16 exposed around the emitter mesa.

GaAsSb can be doped heavily with an about $5\times10^{20}$ cm$^{-3}$ concentration carbon, and the base contact layer 30 to be connected to the base layer 16 is formed of the heavily doped $p^{++}$-GaAsSb layer, whereby the base region can have a much lower sheet resistance $R_B$ and contact resistance.

Preferably the base contact layer 30 is formed of one selected from materials which contain no In and lattice-match with the material of the base layer 16. It is empirically known that In-content groups are apt to have hydrogen passivation. Lattice mismatch introduces lattice deformation which leads to characteristic deterioration.

In a case that a material of the base contact layer 30 is GaAsSb, a composition of $GaAs_{1-x}Sb_x$ has an antimony composition ratio x of $0.1 \leq x \leq 0.9$, whereby the base contact layer 30 can be lattice-matched with the base layer 16 of an InGaAs layer without lattice deformation. When the composition of $GaAs_{1-x}Sb_x$ has an antimony composition ratio x of about 0.5, the lattice constant of GaAsSb is substantially the same as the lattice constant of InGaAs.

To make the base resistance $R_B$ reduction sufficiently effective, it is preferable that the base contact layer 30 is doped with, e.g., a high concentration of about $1\times10^{20}$ cm$^{-3}$. Preferably a dopant concentration in the base contact layer 30 is suitably adjusted in accordance with a film thickness or others of the base contact layer 30.

Figure 3A:
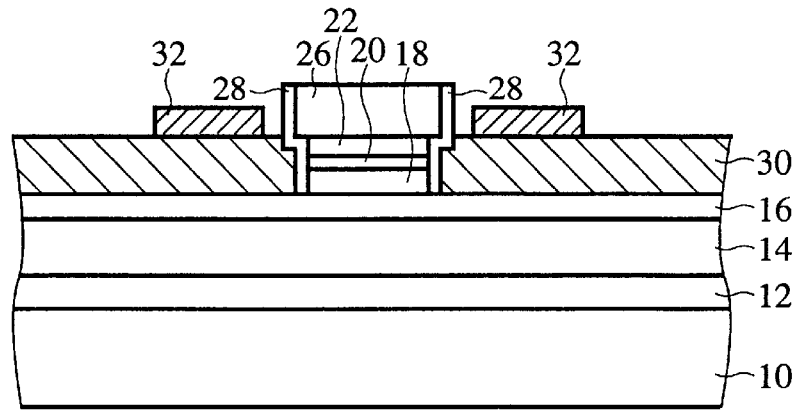

Next, the base electrode 32 of, e.g., a Pt/Ti/Pt/Au structure is formed on the base contact layer 30 by, e.g., lift-off method (FIG. 3A).

Subsequently, a resist mask 34 formed covering the emitter mesa and extended over the base electrode 32 is formed, and then the base contact layer 30, the base layer 16 and the collector layer 14 are sequentially etched with the resist mask 34 and the base electrode 32 as a mask.

Figure 3B:
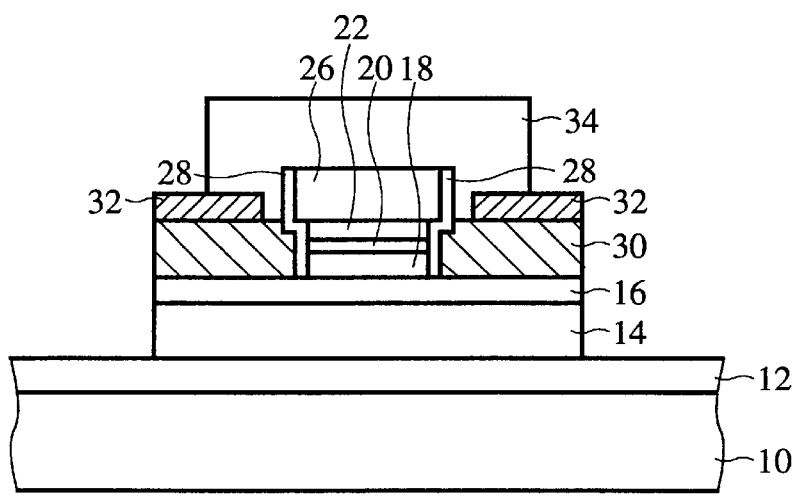

Thus, the base mesa of the collector layer 14, the base layer 16 and the base contact layer 30 is formed (FIG. 3B).

Figure 3C:
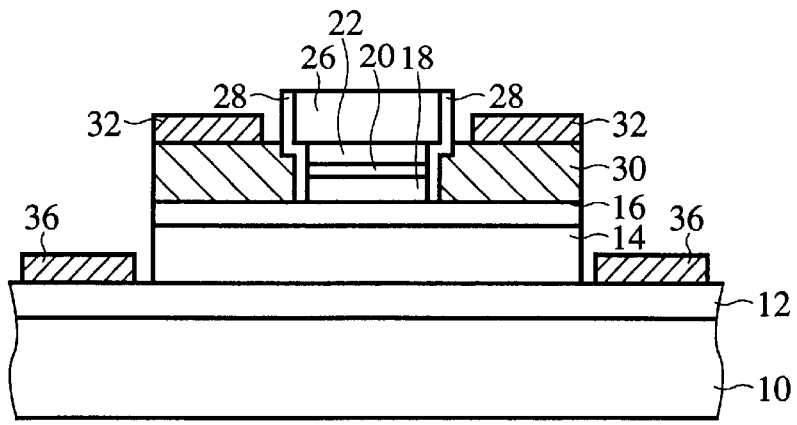

Then, the collector electrode 35 of, e.g., a Ti/Pt/Au structure is formed on the exposed collector contact layer 12 by, e.g., lift-off method (FIG. 3C).

Thus, an HBT including the base layer 16 of a carbon-doped $p^+$-InGaAs layer and the base contact layer 30 of a $p^{++}$-GaAsSb layer having a low resistance can be formed.

As described above, according to the present embodiment, the base contact layer 30 of a heavily carbon-doped $p^{++}$-GaAsSb layer having a low resistance is formed on the base layer 16, whereby a much reduced base resistance $R_B$ can be obtained. Thus, an InP/InGaAs-base HBT can have an increased maximum oscillation frequency $f_{max}$.

A Second Embodiment

The semiconductor device and a method for fabricating the same according to a second embodiment of the present invention will be explained with reference to FIGS. 4, 5A–5B and 6A–6C. The same members of the second embodiment as those of the semiconductor device and the method for fabricating the same according to the first embodiment are represented by the same reference numbers not to repeat or to simplify their explanation.

Figure 4:
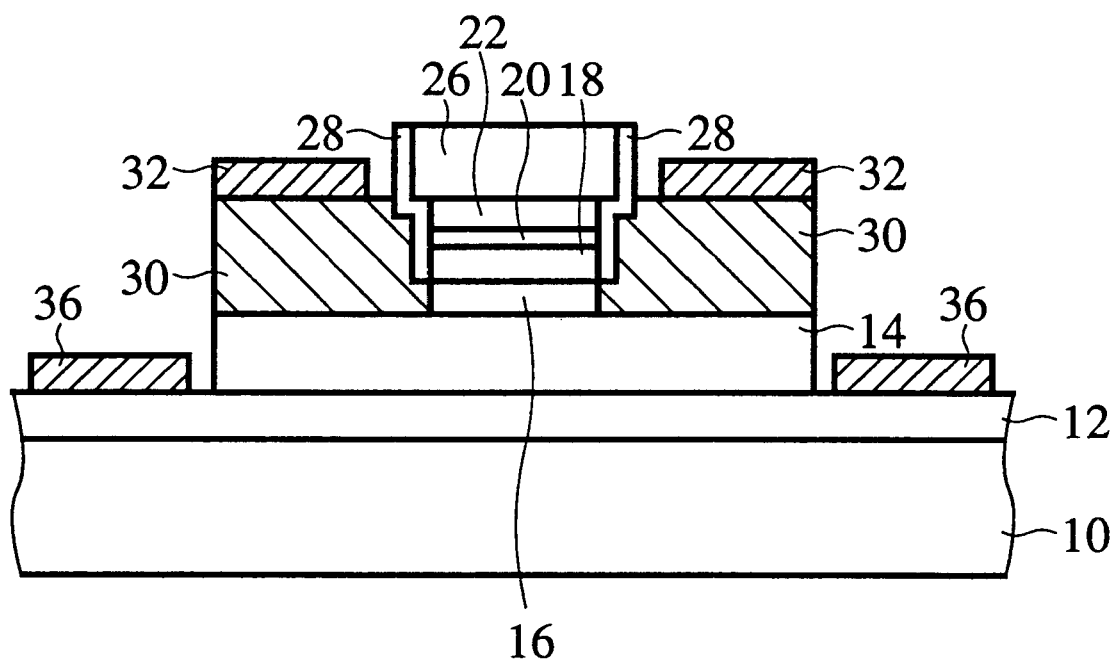
FIG. 4 is a diagrammatic sectional view of the semiconductor device according to a second embodiment of the present invention.

FIG. 4 is a diagrammatic sectional view of the semiconductor device according to the present embodiment, which shows a structure thereof. FIGS. 5A–5B and 6A–6B are sectional views of the semiconductor device in the steps of the method for fabricating the semiconductor device, which show the method.

In the present embodiment another semiconductor device having a decreased base resistance $R_B$ and the method for fabricating the same will be explained.

First, the structure of the semiconductor device according to the present embodiment will be explained with reference to FIG. 4.

In the semiconductor device and the method for fabricating the same according to the first embodiment, the base contact layer 30 of the $p^{++}$-GaAsSb layer is formed on the base layer 16 but may be connected to the base layer 16 at the sides thereof.

That is, as shown in FIG. 4, it is possible that the emitter mesa is formed of the emitter contact layers 22, 20, the emitter layer 18 and the base layer 16, and the base contact layer 30 formed on the collector layer 14 is connected to the base layer 16 at the side surface thereof. The semiconductor device having such structure can have a lower base resistance $R_B$.

Next, the method for fabricating the semiconductor device according to the present embodiment will be explained with reference to FIGS. 5A–5B and 6A–6B.

Figure 5A:
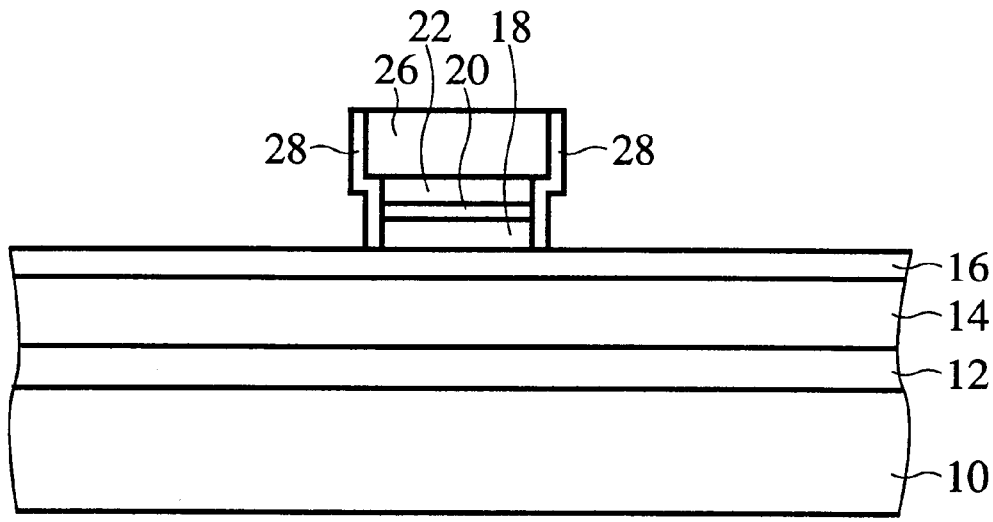
FIGS. 5A–5B and 6A–6B are sectional views of the semiconductor device according to the second embodiment in the steps of the method for fabricating the same, which explain the method.

In the same way as in the method for fabricating the semiconductor device according to the first embodiment shown in FIGS. 2A to 2C, the emitter mesa of the emitter contact layers 22, 20 and the emitter layer 18, and the sidewall insulation film 28 on the side wall of the emitter mesa is formed (FIG. 5A).

Figure 5B:
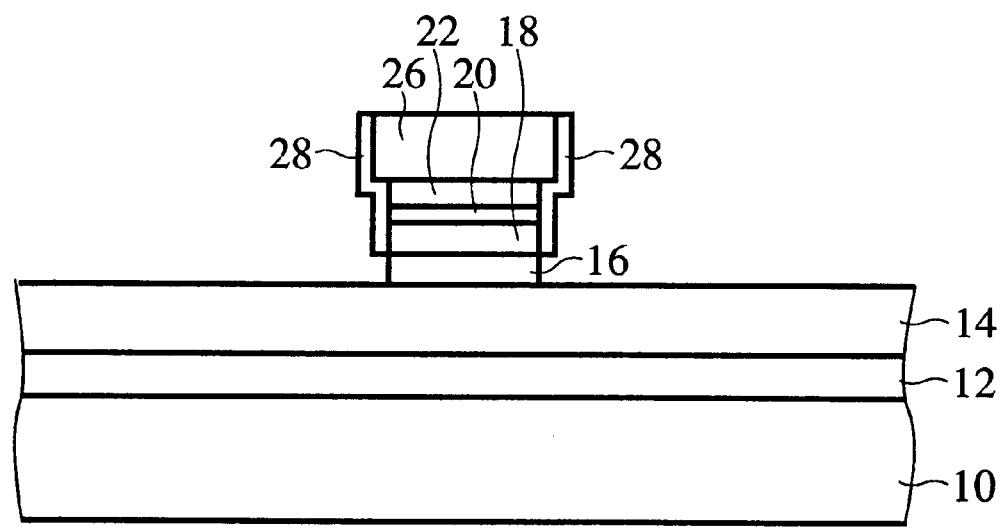

Then, by the use of an etchant of, e.g., $H_3PO_4:H_2O_2:H_2O$ solution, the base layer 16 of a $p^+$-InGaAs layer is selectively etched (FIG. 5B).

Subsequently, the substrate with the emitter mesa thus formed is annealed. This annealing is for eliminating hydrogen introduced into the base layer 16 during the film depositing step, and can prevent hydrogen passivation.

Figure 6A:
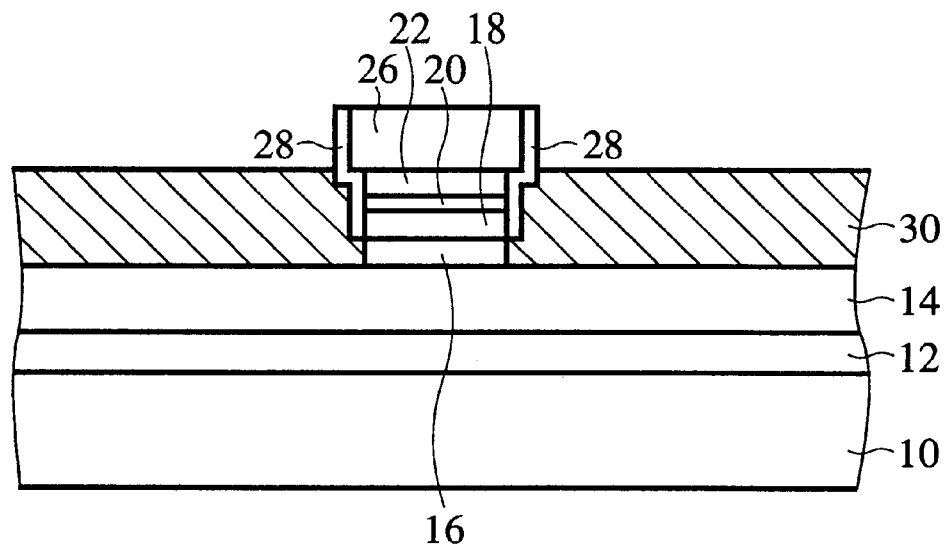

Then, the base contact layer 30 of an about 155 nm-thick $p^{++}$-GaAsSb layer heavily doped with carbon is selectively grown by, e.g., MOCVD method on the collector layer 14 exposed around the emitter mesa (FIG. 6A).

Figure 6B:
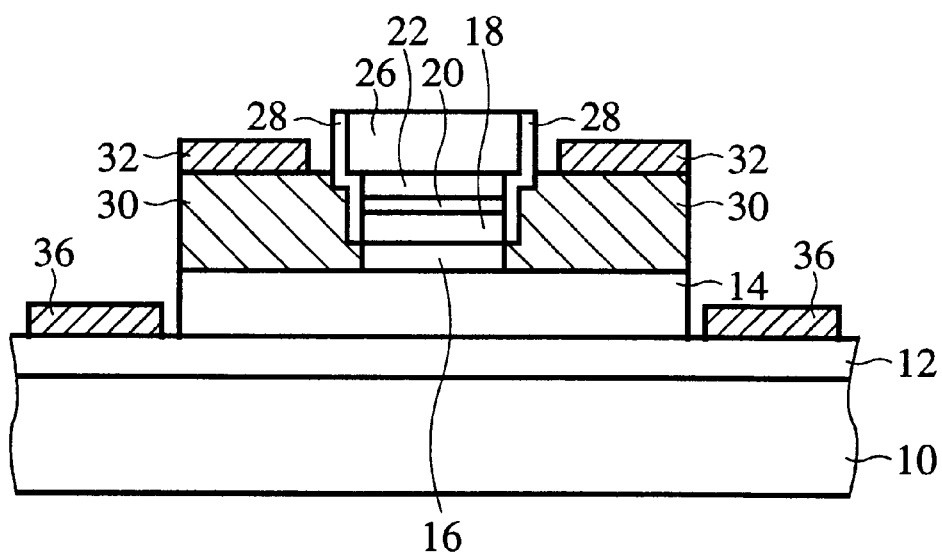

Next, in the same was as in the method for fabricating the semiconductor device according to the first embodiment shown in FIGS. 3A to 3C, an HBT including the base layer 16 of a carbon-doped $p^+$-InGaAs layer, and the base contact layer 30 of $p^{++}$-GaAsSb layer having a low resistance (FIG. 6B).

As described above, according to the present embodiment, the base contact layer 30 of a $p^{++}$-GaAsSb layer is formed connected to the base layer 16 at the side thereof, whereby a very low base resistance $R_B$ can be obtained.

A Third Embodiment

A semiconductor device and a method for fabricating the same according to a third embodiment of the present invention will be explained with reference to FIGS. 7, 8A–8B and 9A–9B.

Figure 7:
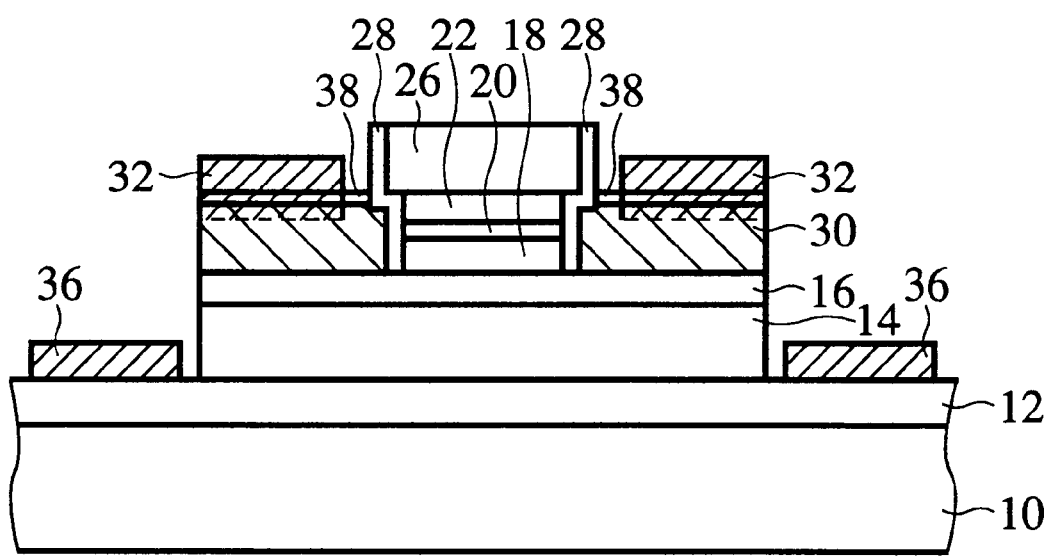
FIG. 7 is a diagrammatic sectional view of the semiconductor device according to a third embodiment of the present invention.

FIG. 7 is a diagrammatic sectional view of the semiconductor device according to the present embodiment, which shows a structure thereof. FIGS. 8A–8B and 9A–9B are sectional views of the semiconductor device according to the present embodiment in the steps of the method for fabricating the same, which show the method.

First, the structure of the semiconductor device according to the present embodiment will be explained with reference to FIG. 7.

The basic structure of the semiconductor device according to the present embodiment is the same as that of the semiconductor device according to the first embodiment shown in FIG. 1 but is characterized in that a surface passivation layer 38 of InP layer is formed on the base contact layer 30.

The surface passivation layer 38 of InP layer is formed on the base contact layer 30 of the $p^{++}$-GaAsSb layer, whereby surface recombination of the $p^{++}$-GaAsSb layer forming the base contact layer 30 can be restrained, whereby size dependence of current gain can be restrained, and higher reliability can be obtained.

In a case that the surface passivation layer 38 is provided, the base electrode 32 is based on an alloy, e.g., Pd/Zn/Pt/Au or others.

Then, the method for fabricating the semiconductor device according to the present embodiment will be explained with reference to FIGS. 8A–8B and 9A–9B.

Figure 8A:
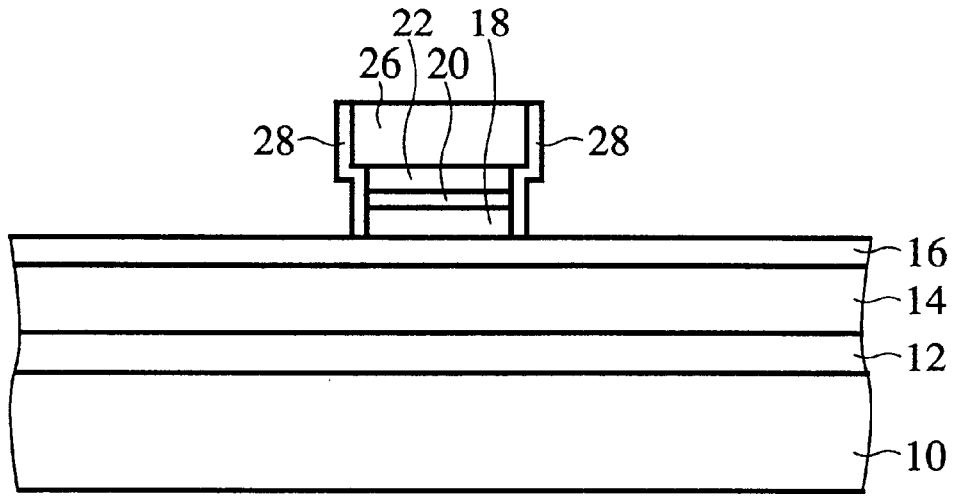
FIGS. 8A–8B and 9A–9B are sectional views of the semiconductor device according to the third embodiment in the steps of the method for fabricating the same, which explain the method.

In the same way as in the method for fabricating the semiconductor device according to, e.g., the first embodiment shown in FIGS. 2A to 2C, the emitter mesa of the emitter contact layers 22, 20 and the emitter layer 18 is formed, and the sidewall insulation film 28 is formed on the side wall of the emitter mesa (FIG. 8A).

Next, the substrate with the emitter mesa thus formed on is annealed. This annealing is for eliminating hydrogen which may be introduced into the base layer 16 during the film forming steps and can prevent hydrogen passivation.

Subsequently, the base contact layer 30 of an about 125 nm-thick $p^{++}$-GaAsSb layer heavily doped with carbon is grown selectively on the base layer 16 exposed around the emitter mesa by, e.g., MOCVD method.

Figure 8B:
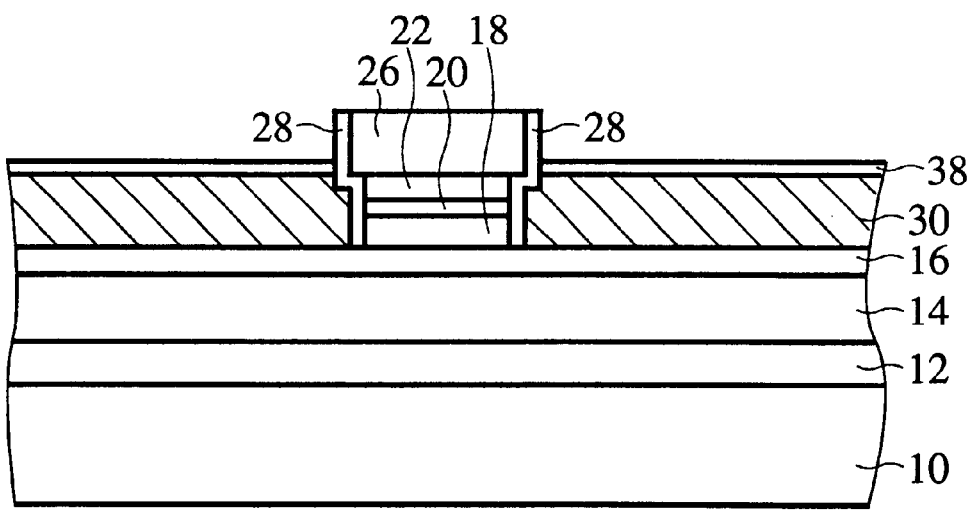

Then, the surface passivation layer 38 of an about 30 nm-thick InP layer is formed on the base contact layer 30 by, e.g., MOCVD method (FIG. 8B).

Next, an electrode material of, e.g., Pd/Zn/Pt/Au structure is deposited on the surface passivation layer 38 by, e.g., lift-off method and alloyed to form the base electrode 32 (FIG. 9A)).

Figure 9A:
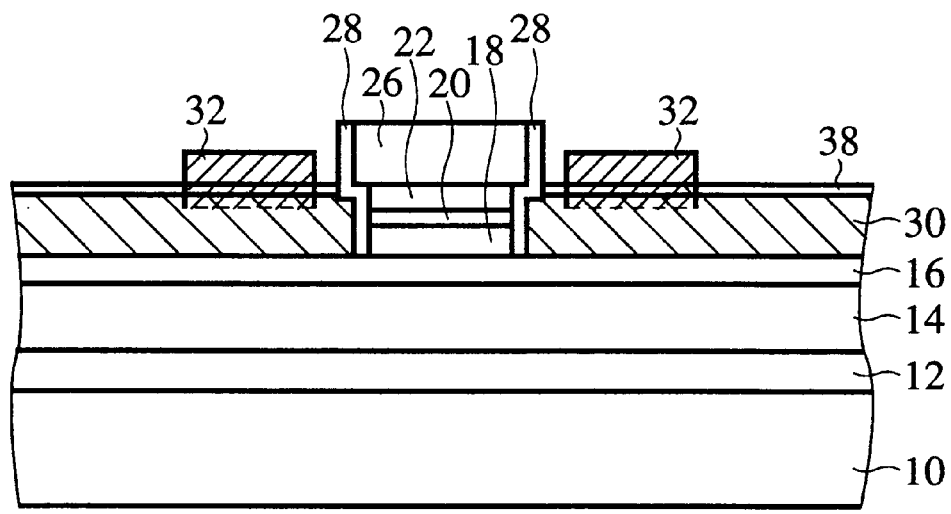
Figure 9B:
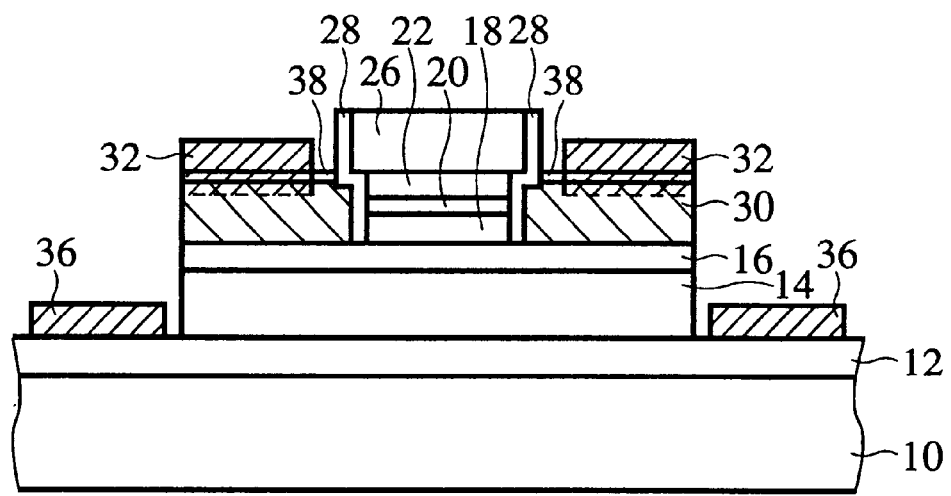

Then, in the same way as in the method for fabricating the semiconductor device according to, e.g., the first embodiment shown in FIGS. 3B and 3C, an HBT including the base layer 16 of a carbon-doped $p^+$-InGaAs layer, and the base contact layer 30 of a $p^{++}$-GaAsSb layer of a low resistance is fabricated (FIG. 9B).

As described above, according to the present embodiment, because of the surface passivation layer 38 covering the surface of the base contact layer 30 of the $p^{++}$-GaAsSb layer, surface recombination on the $p^{++}$-GaAsSb layer forming the base contact layer 30 can be restrained. Thus, size dependence of current gains can be restrained, and higher reliability can be obtained.

In the present embodiment the surface passivation layer 38 is applied to the semiconductor device according to the first embodiment, but the surface passivation layer 38 can be also applied to the semiconductor device according to the second embodiment.

Modifications

The present invention is not limited to the above-described embodiment and covers various modifications.

In the above-described embodiments, the present invention is applied to, e.g., the semiconductor devices of the structures including the collector layer 14, the base layer 16, emitter layer 18 formed on the InP substrate 10 in the stated order but is applicable similarly to the semiconductor device of the so-called collector-up structure including the emitter layer, the base layer and the collector layer deposited on the InP substrate in the stated order.

One example in which the structure of the semiconductor device according to the first embodiment is applied to the semiconductor device of collector-up structure will be explained with reference to FIG. 10.

An emitter contact layer 42 of an n$^+$-InGaAs layer (film thickness: 350 nm, electron concentration: $1 \times 10^{19}$ cm$^{-3}$) is formed on a semi-insulating InP substrate 40. An emitter contact layer 44 of an n$^+$-InP layer (film thickness: 25 nm, electron concentration: $5 \times 10^{18}$ cm$^{-3}$) is formed on the emitter contact layer 42. An emitter layer 46 of an n-InP layer (film thickness: 50 nm, electron concentration: $3 \times 10^{17}$ cm$^{-3}$) is formed on the emitter contact layer 44. A base layer 48 of a p$^+$-InGaAs layer (film thickness: 30 nm, hole concentration: $1 \times 10^{19}$ cm$^{-3}$) is formed on the emitter layer 46. A collector layer 50 of an i-InGaAs layer (film thickness: 300 nm) is formed on the base layer 48. A collector contact layer 52 of an n$^+$-InGaAs layer (film thickness: 50 nm, electron concentration: $1 \times 10^{19}$ cm$^{-3}$) is formed on the collector layer 50. A collector electrode 54 of WSi film is formed on the collector contact layer 52. The collector contact layer 52 and the collector layer 50 are processed in a mesa-shape, and a sidewall insulation film 56 of SiN film is formed on the side wall of the collector mesa. A base contact layer 50 of a p$^{++}$-GaAsSb layer is formed on the exposed base layer 48. A base electrode 60 is formed on the base contact layer 58. The base contact layer 58, the base layer 48, the emitter layer 46 and the emitter contact layer 44 are processed in a mesa-shape, and an emitter electrode 62 is formed on the exposed emitter contact layer 42.

An InP/InGaAs-based HBT of the collector-up structure is thus formed, whereby the semiconductor device of the collector-up structure can have a low base resistance $R_B$.

Figure 10:
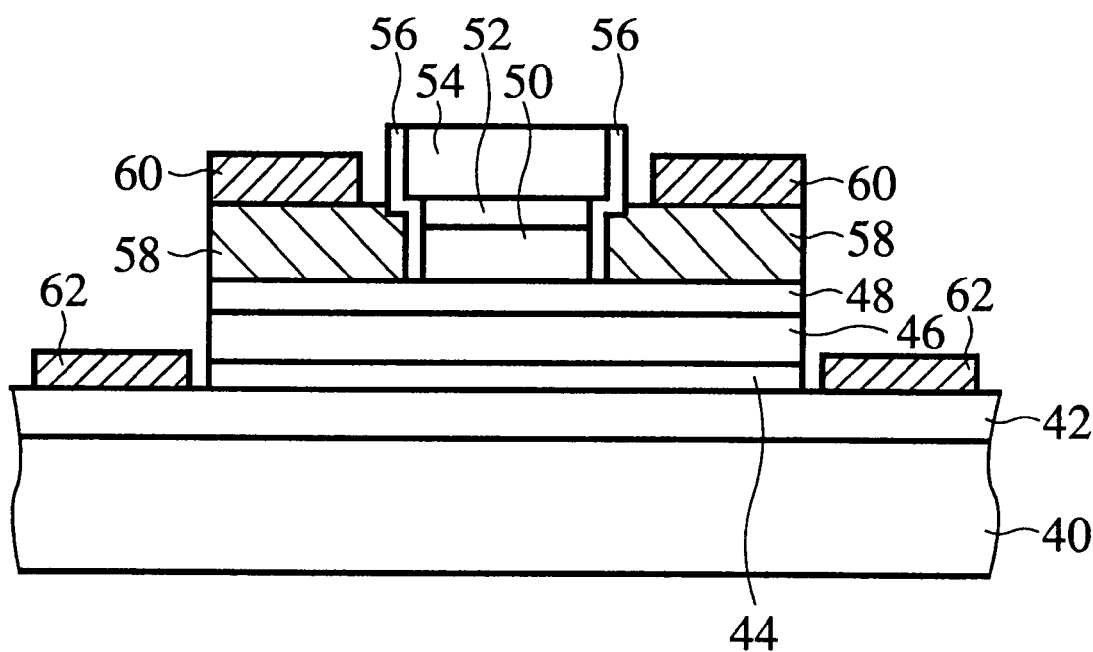
FIG. 10 is a diagrammatic sectional view of the semiconductor device according to one modification of the first embodiment of the present invention.

The semiconductor device shown in FIG. 10 is one example of applications of the structure of the semiconductor device according to the first embodiment to a semiconductor device of the collector-up structure. Similarly the structures of the semiconductor device according to the second and the third embodiments are applicable to semiconductor devices of the collector-up structure.

In the above-described embodiments, the semiconductor device having the base layer 16, 48 of a p$^+$-InGaAs layer has been mainly explained, but the present invention can be widely applicable to the semiconductor device having the base layer of a Ga$_x$In$_{1-x}$As$_y$Sb$_{1-y}$ layer. In the Ga$_x$In$_{1-x}$As$_y$Sb$_{1-y}$ layer, it is preferable that the Ga composition (x) is a range of $0 < x \leq 1$ and the As composition (y) is a range of $0 < y \leq 1$. When the As composition (y) equals to 1, the Ga$_x$In$_{1-x}$As$_y$Sb$_{1-y}$ layer corresponds to the InGaAs layer. When the Ga composition (x) equals to 1, the Ga$_x$In$_{1-x}$As$_y$Sb$_{1-y}$ layer corresponds to the GaAsSb layer. The HBTs having a base layer of the Ga$_x$In$_{1-x}$As$_y$Sb$_{1-y}$ layer can be formed by simply replacing the base layers 16, 48 of the p$^+$-InGaAs layers in the above-described embodiments with the p$^+$-Ga$_x$In$_{1-x}$As$_y$Sb$_{1-y}$ layers.

In the above-described embodiments, the problem of the hydrogen passivation in a case that the base layers 16, 48 are formed of a p$^+$-InGaAs layer has been mainly explained, but the base resistance $R_B$ reduction effect obtained by the presence of the base contact layers 30, 58 is very high also in semiconductor devices including the base layers 16, 48 formed of layers other than p$^+$-InGaAs layer and p$^+$-GaInAsSb layer which are sensitive to the hydrogen passivation effect. Accordingly, even in the case that the base layer is formed of GaAsSb layers, a further low base resistance $R_B$ can be obtained by providing the base contact layers 30, 58. This structure is applicable not only to InP/GaInAsSb-based HBTs but also to GaAs-based HBTs.

The base contact layers 30, 58 are not essentially formed of p$^{++}$-GaAsSb layer. That is, the base contact layer may be formed of any semiconductor layer, e.g., a GaInAsSb layer as long as the material can be epitaxially grown on the base layer, the collector layer or the emitter layer and can provide a low base resistance $R_B$.

In the present modification an example of the application of the structure of the semiconductor device according to the first embodiment to a bipolar transistor of the single hetero structure including the base layer and the collector layer formed of InGaAs layer, but the structure is similarly applicable to a bipolar transistor of the double hetero structure including the collector layer formed of InP layer or InGaAsP layer.

The present invention is similarly applicable to a semiconductor device including the base layers 14, 48 formed of In$_x$Ga$_{1-x}$As and having a gradient composition having a composition ratio x gradually changed.

What is claimed is:

1. A semiconductor device comprising:
   a collector layer;
   a base layer of a carbon-doped Ga$_x$In$_{1-x}$As$_y$Sb$_{1-y}$ layer having one surface connected to the collector layer, a Ga composition x of the Ga$_x$In$_{1-x}$As$_y$Sb$_{1-y}$ layer being more than 0, an As composition y of the Ga$_x$In$_{1-x}$As$_y$Sb$_{1-y}$ layer being more than 0, the Ga composition x of the Ga$_x$In$_{1-x}$As$_y$Sb$_{1-y}$ layer being not 1 when the As composition y of the Ga$_x$In$_{1-x}$As$_y$Sb$_{1-y}$ layer is 1;
   an emitter layer connected to the other surface of the base layer;
   a base contact layer of a carbon-doped GaAsSb layer electrically connected to the base layer, the base layer being lattice-matched with the base layer; and
   a base electrode formed on the base contact layer.

2. A semiconductor device according to claim 1, wherein the base contact layer is formed on said one surface or said other surface of the base layer.

3. A semiconductor device according to claim 1, wherein the base contact layer is formed on a surface of the collector layer connected to the base layer and has a side surface connected to a side surface of the base layer.

4. A semiconductor device according to claim 1, wherein the base contact layer is formed on a surface of the emitter layer connected to the base layer and has a side surface connected to a side surface of the base layer.

5. A semiconductor device according to claim 1, further comprising
   a surface passivation layer for protecting the base contact layer formed on the surface of the base contact layer with the base electrode formed on.

6. A semiconductor device according to claim 1, wherein the As composition y of the Ga$_x$In$_{1-x}$Sb$_{1-y}$ layer is 1, so that the base layer is formed of a InGaAs layer.

7. A semiconductor device according to claim 1, wherein the Ga composition x of the Ga$_x$In$_{1-x}$As$_y$Sb$_{1-y}$ layer is 1, so that the base layer is formed of a GaAsSb layer.

8. A semiconductor device according to claim 1, wherein a dopant concentration of the base contact layer is not less than $1 \times 10^{20}$ cm$^{-3}$.

* * * * *